(12) United States Patent
Stafford et al.

(10) Patent No.: US 7,786,472 B2
(45) Date of Patent: Aug. 31, 2010

(54) QUANTUM INTERFERENCE EFFECT TRANSISTOR (QUIET)

(75) Inventors: Charles Allen Stafford, Tucson, AZ (US); David Michael Cardamone, Burnaby (CA); Sumitendra Mazumdar, Tucson, AZ (US)

(73) Assignee: Arizona Board of Regents/Behalf of University of Arizona, Tucson, AZ (US)

( * ) Notice: Subject to any disclaimer, the term of this patent is extended or adjusted under 35 U.S.C. 154(b) by 531 days.

(21) Appl. No.: 11/688,769

(22) Filed: Mar. 20, 2007

(65) Prior Publication Data

US 2007/0215861 A1 Sep. 20, 2007

Related U.S. Application Data

(60) Provisional application No. 60/784,503, filed on Mar. 20, 2006.

(51) Int. Cl.
*H01L 51/00* (2006.01)
(52) U.S. Cl. .................... 257/40; 438/99; 977/709
(58) Field of Classification Search .............. 257/40; 977/709; 438/99
See application file for complete search history.

(56) References Cited

U.S. PATENT DOCUMENTS

| 6,339,227 B1 * | 1/2002 | Ellenbogen .................. 257/40 |
| 2005/0101063 A1 * | 5/2005 | Tour et al. .................... 438/142 |

FOREIGN PATENT DOCUMENTS

WO    WO 01/13432    * 2/2001

OTHER PUBLICATIONS

C. Joachim, J. K. Gimzewski, An electromechanical amplifier using a single molecule, Chemical Physics Letters, vol. 265, Issues 3-5, Feb. 7, 1997, pp. 353-357, ISSN 0009-2614, DOI: 10.1016/S0009-2614(97)00014-6.*
D.M. Cardamone et al., "The Quantum Interference Effect Transistor", arXiv:cond-mat/0503540v 1 [cond-mat.mes-hall] Mar. 22, 2005, pp. 1-7.
David Cardamone et al., "Bulletin of the American Physical Society" Monday-Friday, Mar. 21-25, 2005, Los Angeles, CA, 1 page.
David Michael Cardamone, "Dephasing and Decoherence in Open Quantum Systems: A Dyson's Equation Approach", Aug. 4, 2005, pp. 1-130.

* cited by examiner

*Primary Examiner*—Kiesha R Bryant
*Assistant Examiner*—Mark W Tornow
(74) *Attorney, Agent, or Firm*—Oblon, Spivak, McClelland, Maier & Neustadt, L.L.P.

(57) ABSTRACT

A molecular-based switching device and method for controlling charge transport across a molecule. The molecular-based switching device includes a molecule having first and second nodes in between which destructive quantum interference restricts electrical conduction from the first node to the second node in an off-state, a first electrode connected to the first node and configured to supply charge carriers to the first node, a second electrode connected to the second node and configured to remove the charge carriers from the second node, and a control element configured to reduce coherence in or alter charge transport paths between the first and second nodes so as to reduce existing destructive quantum interference and permit flow of the charge carriers from the first node to the second node. The method applies an electric potential between the first and second electrodes, controls coherence in charge transport paths between the first and second nodes so as to maintain or reduce destructive interference between the first and second nodes of the molecule, and injects charge carriers from the first electrode into the first node and collects the charge carriers from the second node at the second electrode when the coherence is controlled to reduce destructive interference.

27 Claims, 9 Drawing Sheets
(3 of 9 Drawing Sheet(s) Filed in Color)

Destructive Quantum Interference

Non-aromatic Molecules: Stubs, non-aromatic rings, etc.

Aromatic Rings

Benzene

[14]annulene

[18]annulene

Divalent Metal-phthalocyanine

QUANTUM INTERFERENCE EFFECT TRANSISTOR (QUIET)

CROSS REFERENCE TO RELATED APPLICATIONS

This application is related and claims priority under 35 U.S.C. 119(e) to U.S. application Ser. No. 60/784,503, entitled "Quantum Interference Effect Transistor (QuIET)," filed on Mar. 20, 2006, the entire contents of which are incorporated herein by reference.

STATEMENT REGARDING FEDERALLY SPONSORED RESEARCH

The U.S. Government may have a paid-up license in this invention and the right in limited circumstances to require the patent owner to license others on reasonable terms as provided for by the terms of the following Federal Funding from the National Science Foundation (NSF): PHY0210750, DMR0312028, DMR0406604, and PHY0244389.

BACKGROUND OF THE INVENTION

1. Field of the Invention

This invention is related to nanoscale switching devices in which conduction through the switching devices is controlled by quantum effects.

2. Description of the Related Art

From the vacuum tube to the modern CMOS transistor, devices which control the flow of electrical current by modulating an electron energy barrier are ubiquitous in electronics. In this paradigm, switching the electrical current by raising and lowering the barrier, which must have a height greater than $k_B T$, generates a commensurate amount of heat, thereby necessitating incredible power dissipation at device densities approaching the atomic limit.

Since about 1960, the steady downscaling of integrated circuit minimum dimensions has permitted ever-increasing density and thus an ever-increasing range of functionality at an ever-more favorable cost. This capability has permitted system designers to introduce many of the electronic products which have revolutionized industry and daily life in these decades. Continued downscaling steadily improves the available functionalities and pricing, while steadily challenging system designers.

However, it is expected that the downscaling of minimum geometries of transistor-based integrated circuits will eventually be brought to an end by a combination of problems related to devices, interconnections, noise, and reliability. These problems include power dissipation, limitations in lithographic printing, thermal stability, dopant diffusion lengths, punch-through, doping levels, electric fields, and hot electrons to name a few.

Conventional semiconductor integrated circuit technology uses a monolithic substrate which is all one crystal. Such substrates provide great advantages in processing. However, such device architecture poses difficulties for future scaling. One difficulty is lateral isolation of devices from each other. Another difficulty is leakage current scaling. Another difficulty is the diffusivity of carriers within the substrate, as free carriers (generated, e.g., by an alpha particle hit) can diffuse over many tens of microns and neutralize a stored charge.

Nevertheless, progress in semiconductor nanofabrication and nanoscale spatial and charge quantization phenomena has bridged the gap from the 0.1 micron regime to the 10's of nanometer scale, and even to the atomic level with scanning probe techniques. These advances allow one to create electronic structures that exhibit manifest quantum and single-electron effects.

However, many proposed solid state device implementations at this level suffer from a number of problems. For example, critical dimensional control for devices that operate by tunneling is a problem since a barrier (e.g., a heterostructure, oxide, or otherwise) is a prerequisite for isolation in a 3-terminal device that can exhibit gain, and dimensional variations result in decidedly different device performance. Moreover, electron tunneling is exponentially sensitive to atomic-layer fluctuations in the tunneling barriers, resulting in device characteristic variations unacceptable for large scale integration. Meanwhile, device embodiments utilizing discrete electron charging (single-electron transistors, or SETs) suffer from reduced operating temperatures; for room temperature operation, 1 nm or less size junctions are required, dimensions which imply severe tunnel barrier fluctuation problems for solid state embodiments.

Another possible alternative to traditional electron current modulation is to exploit the wave nature of the electron to control current flow on the nanoscale. In traditional mesoscopic devices, interference of electron waves is typically tuned via the Aharanov-Bohm effect. However, for nanoscale devices such as single molecules, this is impractical due to the enormous magnetic fields required to produce a phase shift of order 1 radian. Similarly, a device based on an electrostatic phase shift would require, for the small molecules being considered, voltages incompatible with structural stability.

Thus, prior work directed to miniaturizing switching devices to the molecular dimension has been frustrated by a suitable means to control and/or modulate current flow through the nano-sized medium.

SUMMARY OF THE INVENTION

In one embodiment of the present invention, there is provided a molecular-based switching device including a molecule having first and second nodes in between which destructive quantum interference restricts electrical conduction from the first node to the second node in an off-state, a first electrode connected to the first node and configured to supply charge carriers to the first node, a second electrode connected to the second node and configured to remove charge carriers from the second node, and a control element configured to reduce coherence in or alter charge transport paths between the first and second nodes so as to reduce existing destructive quantum interference and permit flow of the charge carriers from the first node to the second node.

In one embodiment of the present invention, there is provided a method for controlling electrical transport across a molecule having first and second nodes in between which destructive quantum interference restricts electrical transport from the first node to the second node. The method applies an electric potential between first and second electrodes connected respectively to the first and second nodes of the molecule, controls coherence in charge transport paths between the first and second nodes so as to maintain or reduce destructive interference between the first and second nodes of the molecule, and injects charge carriers from the first electrode into the first node and collects the charge carriers from the second node at the second electrode when the coherence is controlled to reduce destructive interference.

In one embodiment of the present invention, there is provided an integrated switching device including the molecular-based switching device described above and a semiconductor device wafer including electrical devices.

It is to be understood that both the foregoing general description of the invention and the following detailed description are exemplary, but are not restrictive of the invention.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee.

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The present invention addresses the shortcomings of prior approaches to molecular based devices by exploiting destructive quantum interference in molecules which without more would prevent electrical conduction through the molecules. In one embodiment of the present invention, the controlled introduction of for example decoherence and/or elastic scattering permits quantum transport and thus electrical conduction through nodes of a molecule whose conduction as described above would otherwise be restricted.

Figure 1A:
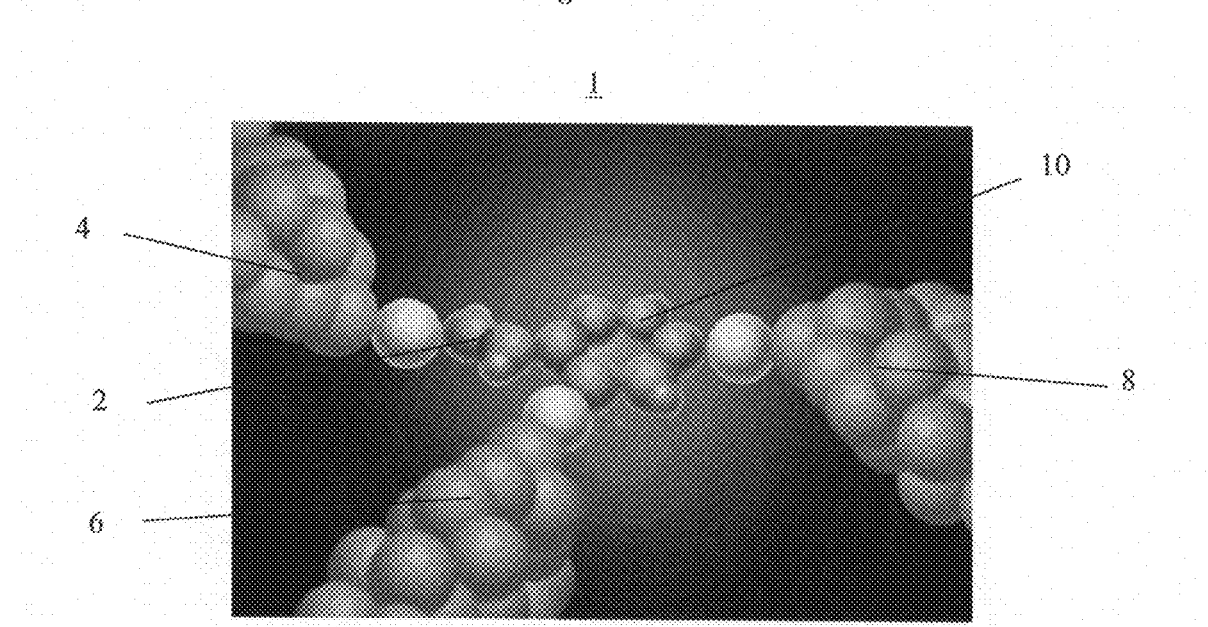
FIG. 1A is a pictorial of one embodiment of the quantum interference effect transistor of the present invention based on sulfonated vinylbenzene.
Figure 1B:
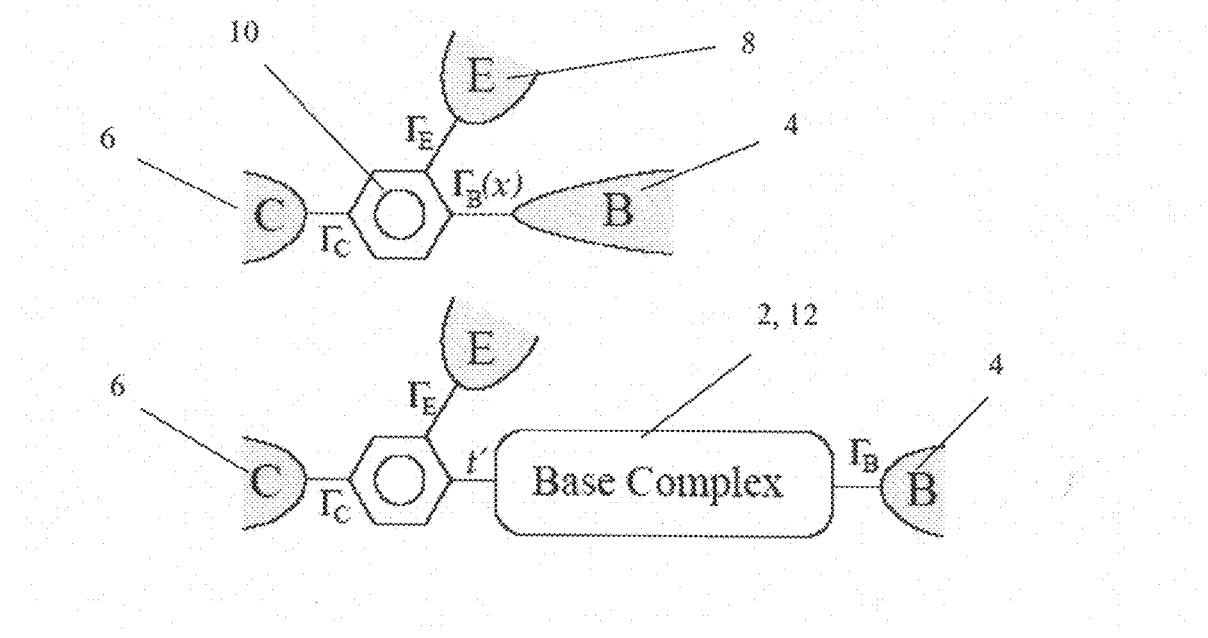
FIG. 1B is a schematic of one embodiment of the quantum interference effect transistor of the present invention based on benzene.

Referring now to the drawings, wherein like reference numerals designate identical or corresponding parts throughout the several views, FIG. 1A is a pictorial of one embodiment of the quantum interference effect transistor 1 of the present invention. The colored spheres represent individual carbon (green), hydrogen (purple), and sulfur (yellow) atoms, while the three gold structures represent the metallic electrodes. Similarly, FIG. 1B is a schematic of this embodiment in which the emitter (E), collector (C), and base (B) electrodes are denoted for purposes of illustration.

FIG. 1A shows a vinyl linkage 2 electrically coupled to a gate electrode 4 (at upper left), functioning as a control element suitable for the present invention. However, other molecular sidegroups, for example alkene chains containing four, six, or more carbon atoms, attached to the phenyl moiety can replace the vinyl linkage, providing for control elements of arbitrary length with tunable electronic properties.

As seen in these figures, the quantum interference effect transistor of the present invention in one embodiment is a three terminal device, similar in operation to a traditional bipolar transistor three terminal device including a first electrode 6 and a second electrode 8 in that a voltage between (acting as a current source or an emitter and a current drain or a collector) normally produces no current flow when the device is in an OFF state, and conducts current when the device is in the ON state. In other words, bias on the base (or gate) electrode removes the destructive quantum interference effect, thereby permitting charge transport through molecule 10 in this case phenyldithiol. As shown in FIG. 1B a base complex 2, 12 can be used for a connection to the electrode 4.

Single molecules or single molecular chains of molecules (as described above) offer some practical advantage in terms of fabrication over other types of nanostructures, in that large numbers of identical "devices" can be readily synthesized. Single-molecule devices with two leads have been fabricated by a number of techniques such as those techniques described by Nitzan, A.; Ratner, M. A. Science (Washington, D.C.) 2003, 300, 1384, the entire contents of which are incorporated herein by reference. These and similar techniques are applicable to the present invention. The three-terminal quantum interference effect transistor 1 of the present invention requires a third terminal. In different embodiments of the present invention, the third terminal is coupled to the molecule, such as for example either capacitively or via tunneling.

Besides three-terminal quantum interference effect transistors, the concepts detailed herein are applicable to devices with more than three terminals, where for example multiple control terminals or multiple source/drain terminals could be used. However, the advantages gained in conventional transistor devices by having additional source/drain or control gates may not be as pronounced here in the quantum molecular scale devices where electrical transport is determined primarily by quantum mechanical factors. Further, details of fabrication of the quantum interference effect transistors of the present invention will be described in more detail below after a discussion of the quantum mechanical transport basis.

Embodiments of the quantum interference effect transistor may also contain only two electrodes, 6, 8 in cases for which control is implemented by some other method than a third electrode 4, for example by pH, or the presence of environmental molecules.

The present invention, while not bound to any particular details of theory, may be illustrated through the modeling work detailed below, which demonstrates the principles of the present invention and yields a more fundamental understanding of the factors influencing control of the quantum interference effect transistors of the present invention.

Nonequilibrium Green function (NEGF) calculations, both within the self-consistent Hartree-Fock approximation and using exact diagonalization of the molecular many-body Hamiltonian, have been used to model monocyclic aromatic annulenes in two-terminal configurations in which destructive interference blocks current flow and by modeling the effects of supplying tunable decoherence or scattering from a third terminal by way of an alkene chain of arbitrary length or a metallic STM tip. The theoretical principles utilized in these calculations are consistent with the current art in the fields of physics, chemistry, and electrical engineering, and are described by Cardamone, D. M.; Stafford, C. A.; Mazumdar, S. Nano Letters 2006, 6, 2422, the entire contents of which are incorporated herein by reference. These models indicate that the quantum interference effect transistors of the present invention function at room temperature with current-voltage characteristics strikingly similar to macroscale transistors.

In one embodiment of the present invention, the quantum interference effect transistor is operated at room temperature and operates in a voltage regime where there are no unpaired electrons in the molecule. Thus lead-lead and lead-molecule correlations, such as the Kondo effect, do not play an important role.

Figure 2:
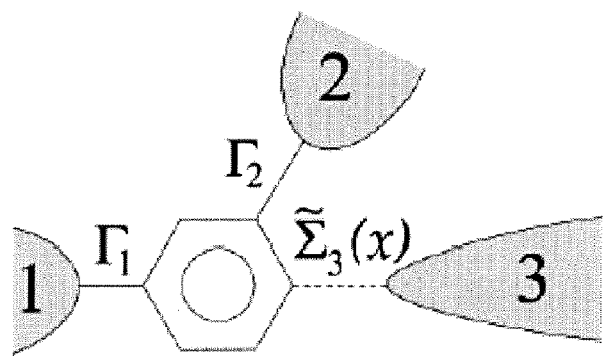
FIG. 2 is a schematic of one embodiment of the quantum interference effect device of the present invention in which electrical contacts to benzene are at the meta positions.
Figure 3:
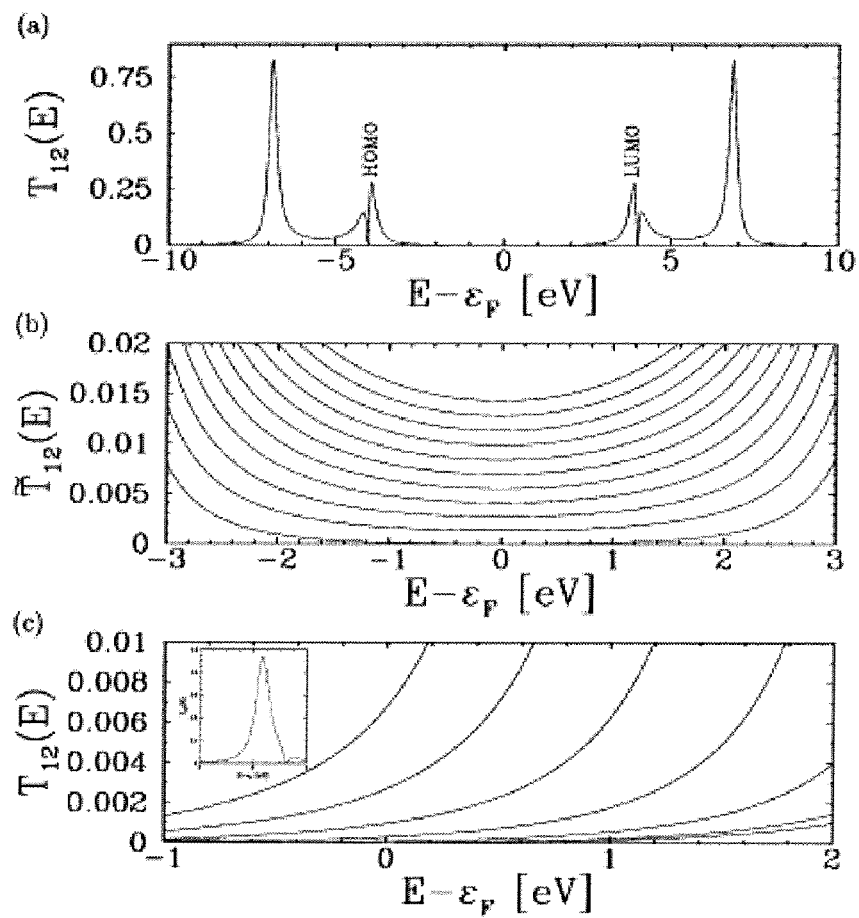
FIG. 3A is a plot showing the transmission probability of the quantum interference effect device shown in FIG. 2.
FIG. 3B is a plot showing a node in the transmission probability, located midway between the HOMO and LUMO energy levels of the benzene ring.
FIG. 3C is a plot showing the transmission probability in the vicinity of the Fermi energy of the molecule for the case of a single side orbital.

In one embodiment of the present invention, the quantum interference stems from the symmetry of monocyclic aromatic annulenes such as phenyldithiol 10. Quantum transport through single benzene molecules with two metallic leads connected at para positions has been well studied. The results of the present invention extend the prior work and show that a unique functionality results when source and drain are connected to benzene at meta positions, as illustrated in FIG. 2. The transmission probability $T_{12}$ of this device is shown in FIG. 3A. Due to the molecular symmetry, there is a node in $T_{12}(E)$, located midway between the HOMO and LUMO energy levels, See FIG. 3B, lowest curve. This midgap node, at the Fermi level of the molecule, plays a prominent role in the operation of the quantum interference effect transistor.

The existence of a transmission node for the meta connection can be understood in terms of the Feynman path integral formulation of quantum mechanics, according to which an electron moving from lead 1 to lead 2 takes all possible paths within the molecule. Observables relate only to the complex sum over paths. In the absence of a third lead, these paths all lie within the benzene ring. An electron entering the molecule at the Fermi level has de Broglie wavevector $k_F=\pi/2d$, where d of 1.397 Å is the intersite spacing of benzene. $k_F$ is a purely geometrical quantity, which is unaltered by electron-electron interactions. The two most direct paths through the ring have lengths 2d and 4d, with a phase difference $k_F 2d=\pi$, so they interfere destructively. Similarly, all of the paths through the ring cancel exactly in a pairwise fashion, leading to a node in the transmission probability at $E=\epsilon_F$.

This transmission node can be lifted by introducing decoherence or elastic scattering that breaks the molecular symmetry. FIG. 3B and 3C illustrate the effect of attaching a third lead to the molecule as shown in FIG. 2, introducing a complex self-energy on the π-orbital adjacent to that connected to lead 2. An imaginary self-energy corresponds to coupling a third metallic lead directly to the benzene molecule. If the third lead functions as a high-impedance voltage probe, the effective two-terminal transmission is $$\tilde{T}_{12} = T_{12} + \frac{T_{13}T_{32}}{T_{13}T_{32}} \quad (9)$$

The third lead introduces decoherence and additional paths that are not canceled, thus allowing current to flow, as shown in FIG. 3B.

Figure 1C:
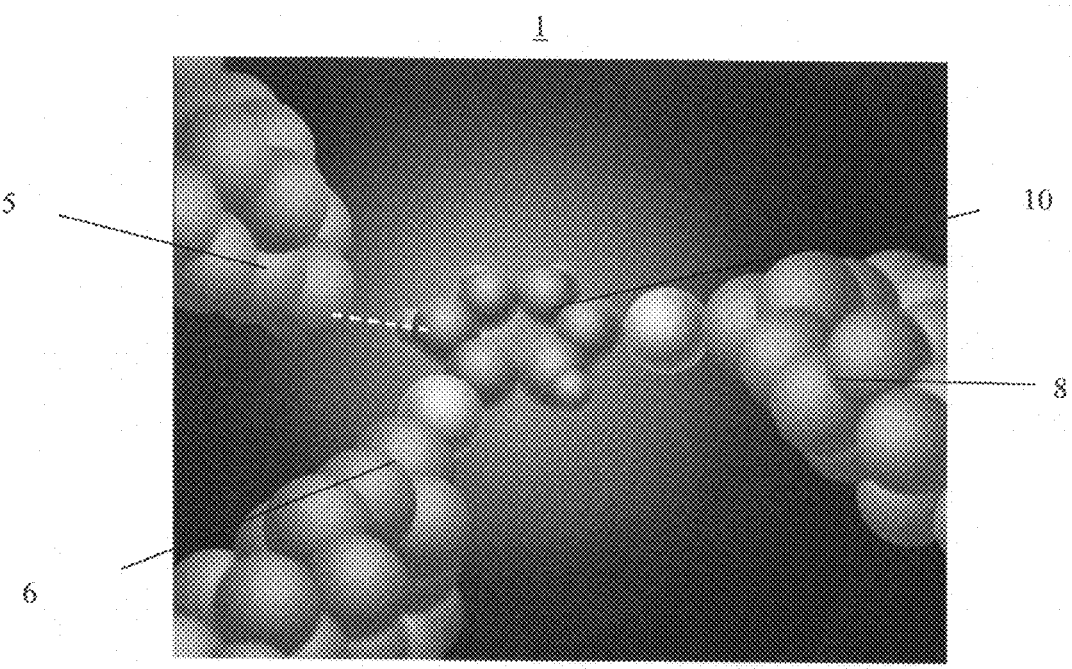
FIG. 1C is a pictorial of one embodiment of the quantum interference effect transistor of the present invention based on proximity control of charge transport in benzene-1,3-dithiol.

In one embodiment of the present invention, a quantum interference effect transistor 1 can be constructed using a scanning tunneling microscope tip as a third lead, as shown in FIG. 1C, eliminating the vinyl 2 in FIG. 1A. In this configuration, the third lead 5 uses tunneling coupling $\Gamma_3(\chi)$ to the appropriate π-orbital of the benzene ring 10, the control variable x being a piezovoltage controlling the tip-to-benzene molecule distance. Thus, while the tip in this embodiment would not directly contact the benzene ring, the virtual tunneling of electrons back and forth from the tip to the benzene ring 10 introduces decoherence in the benzene ring.

A real self-energy introduces elastic scattering, which can also break the molecular symmetry. This can also be achieved by attaching a second molecule to the benzene ring, for example an alkene chain as shown in FIGS. 1A and 1B. The retarded self-energy due to the presence of a second molecule is $$\tilde{\Sigma}_3(E) = \sum_v \frac{|t_v|^2}{E - \epsilon_v + i0^+} \quad (10)$$

where $\epsilon_v$, is the energy of the vth molecular orbital of the second molecule, and $t_v$ is the hopping integral coupling this orbital with the indicated site of benzene. FIG. 3c shows the transmission probability $T_{12}(E)$ in the vicinity of the Fermi energy of the molecule, for the case of a single side orbital at $\epsilon_v=\epsilon_F+4$ eV. As the coupling $t_v$ is increased, the node in transmission at $E=\epsilon_F$ is lifted due to scattering from the side orbital. The side group introduces Fano antiresonances, which suppress current through one arm of the annulene, thus lifting the destructive interference. Put another way, the second molecule's orbitals hybridize with those of the annulene, and a state that connects leads 1 and 2 is created in the gap (see FIG. 3c (inset)). In practice, either $t_v$ or $\epsilon_v$ might be varied to control the strength of Fano scattering.

Tunable current suppression occurs over a broad energy range, as shown in FIG. 3b; a quantum interference effect transistor functions with any metallic leads whose work function lies within the annulene gap. Fortunately, this is the case for many bulk metals, among them palladium, iridium, platinum, and gold. Appropriately doped semiconductor electrodes could also be used. Furthermore, the metallic leads could be replaced by conducting polymers, such as polyaniline or polythiophene, chemically bonded to the annulene.

Figure 4:
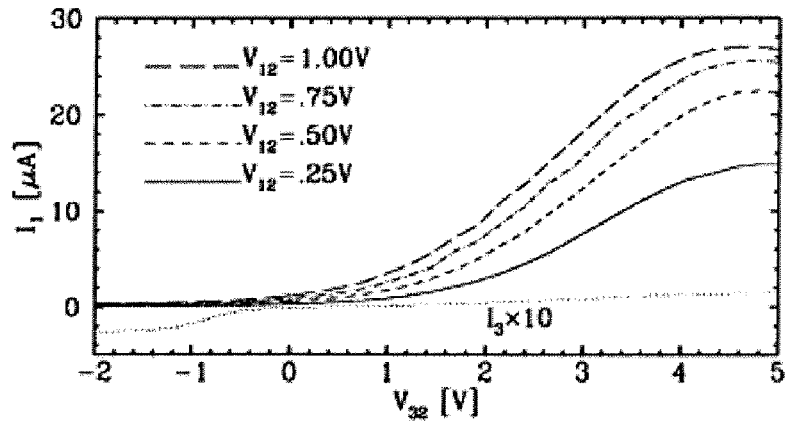
FIG. 4 is a model-derived I-V characteristic of a quantum interference effect transistor based on sulfonated vinylbenzene, whose molecular structure is given in FIG. 1.

FIG. 4 is a model-derived I-V characteristic of a quantum interference effect transistor based on sulfonated vinylbenzene, whose structure is given in FIG. 1A. The three metallic electrodes were taken as bulk gold, with $\Gamma_1=\Gamma_2=1$ eV, while $\Gamma_3=0.0024$ eV, so that the coupling of the third electrode to the alkene sidegroup is primarily electrostatic. The device characteristic resembles that of a macroscopic transistor. As the voltage on lead 3 is increased, scattering from the antibonding orbital of the alkene sidegroup increases as it approaches the Fermi energies of leads 1 and 2, leading to a broad peak in the current.

For $\Gamma_{1,2} \gg \Gamma_3 \neq 0$, the device amplifies the current in the third lead (dotted curve), emulating a bipolar junction transistor. Alkene chains containing four and six carbon atoms were also found to be suitable for the present invention, and would yield devices with characteristics similar to that shown in FIG. 4, with the maximum current $I_1$ shifting to smaller values of $V_{32}$ with increasing chain length. In practice, longer alkene chains could also be used, without deviating from the concept of the present invention.

Figure 5:
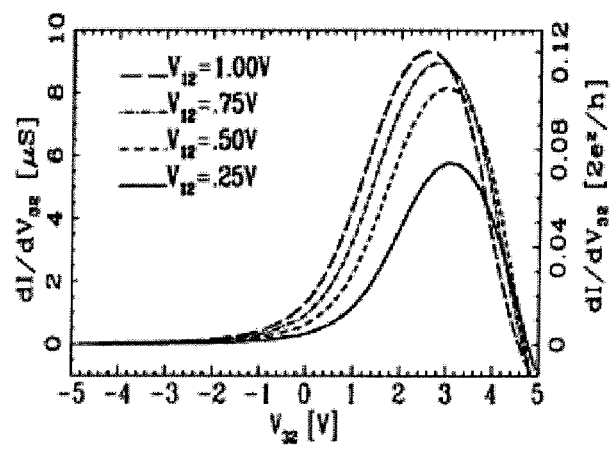
FIG. 5 is a plot showing the transconductance of the quantum interference effect transistor shown in FIG. 1A.

For $\Gamma_3=0$, $I_3=0$ and the quantum interference effect transistor behaves as a field-effect transistor. The transconductance $dI/dV_{32}$ of such a device is shown in FIG. 5. For comparison, an ideal single-electron transistor with $\Gamma_1=\Gamma_2=1$ eV has peak transconductance $(1/17)G_0$ at bias voltage 0.25 V and $(1/2)G_0$ at bias 1 V, where $G_0=2e^2/h$ is the conductance quantum. For low biases, the quantum interference effect transistor of the present invention has a higher transconductance than the prototypical nanoscale amplifier, while even for large biases its peak transconductance is comparable. Likewise, the load resistances required for a quantum interference effect transistor to have gain (load times transconductance) greater than 1 while in its "on" state are comparable to other nanoscale devices, $\sim 10/G_0$.

Operation of the quantum interference effect transistor does not depend strongly on the magnitude of the lead-molecule coupling $\Gamma_1\Gamma_2/(\Gamma_1+\Gamma_2)$. The current through the device decreases with decreasing coupling, but aside from that, the device characteristic was found to be qualitatively similar when the coupling was varied over 1 order of magnitude. The quantum interference effect transistor is also insensitive to molecular vibrations: Only vibrational modes that simultaneously alter the carbon-carbon bond lengths and break the 6-fold symmetry within the benzene component can cause decoherence in the benzene ring. Such modes are only excited at temperatures greater than about 500 K.

Figure 6:
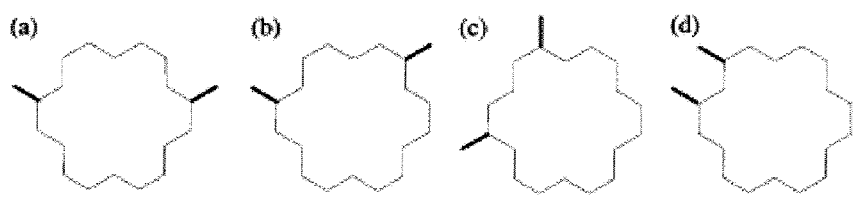
FIG. 6 is a schematic of another embodiment of the quantum interference effect transistor based on [18]-annulene.

The quantum interference effect transistor mechanism applies to any monocyclic aromatic annulene with leads 1 and 2 positioned so the two most direct paths have a phase difference of $\pi$. Furthermore, larger molecules have other possible lead configurations, based on phase differences of $3\pi$, $5\pi$, etc. FIG. 6 shows lead configurations for a quantum interference effect transistor based on [18]-annulene. Other aromatic molecules, such as divalent metal-phthalocyanine could be utilized in a similar fashion.

Figure 10:
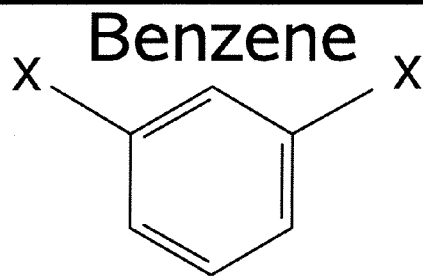
FIG. 10 is a diagram categorizing embodiments of the quantum interference effect transistor by method of providing destructive quantum interference.
Figure 10:
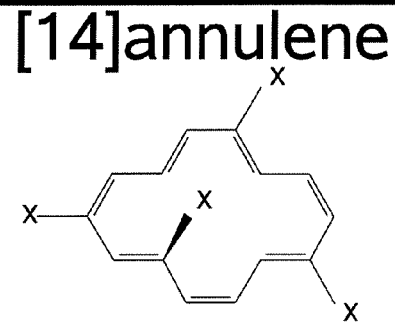
Figure 10:
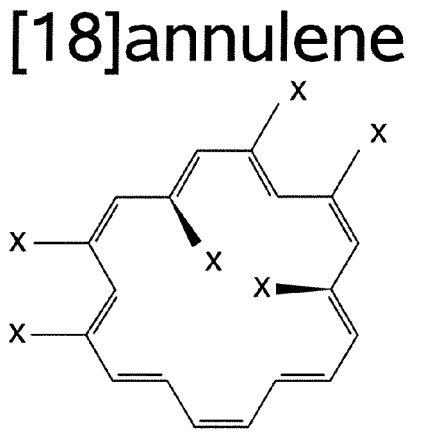
Figure 10:
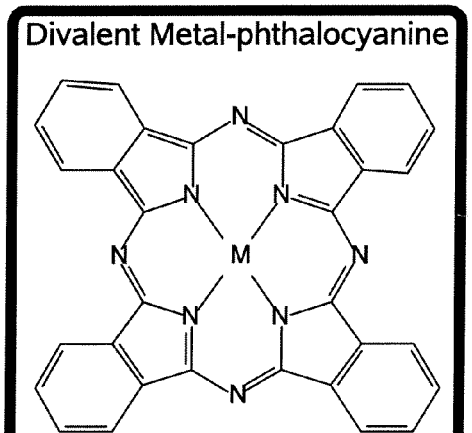

FIG. 10 presents a diagram categorizing various embodiments of the quantum interference effect transistor by the type of molecular element which introduces destructive quantum interference. In this figure, some lead binding sites for which the requisite odd-integer-times-$\pi$ phase difference is achieved are indicated by an "X". The possibilities of both aromatic and non-aromatic molecular structures are considered, and various examples of aromatic rings which can be used in different embodiments of the quantum interference effect transistor are presented.

Figure 11:
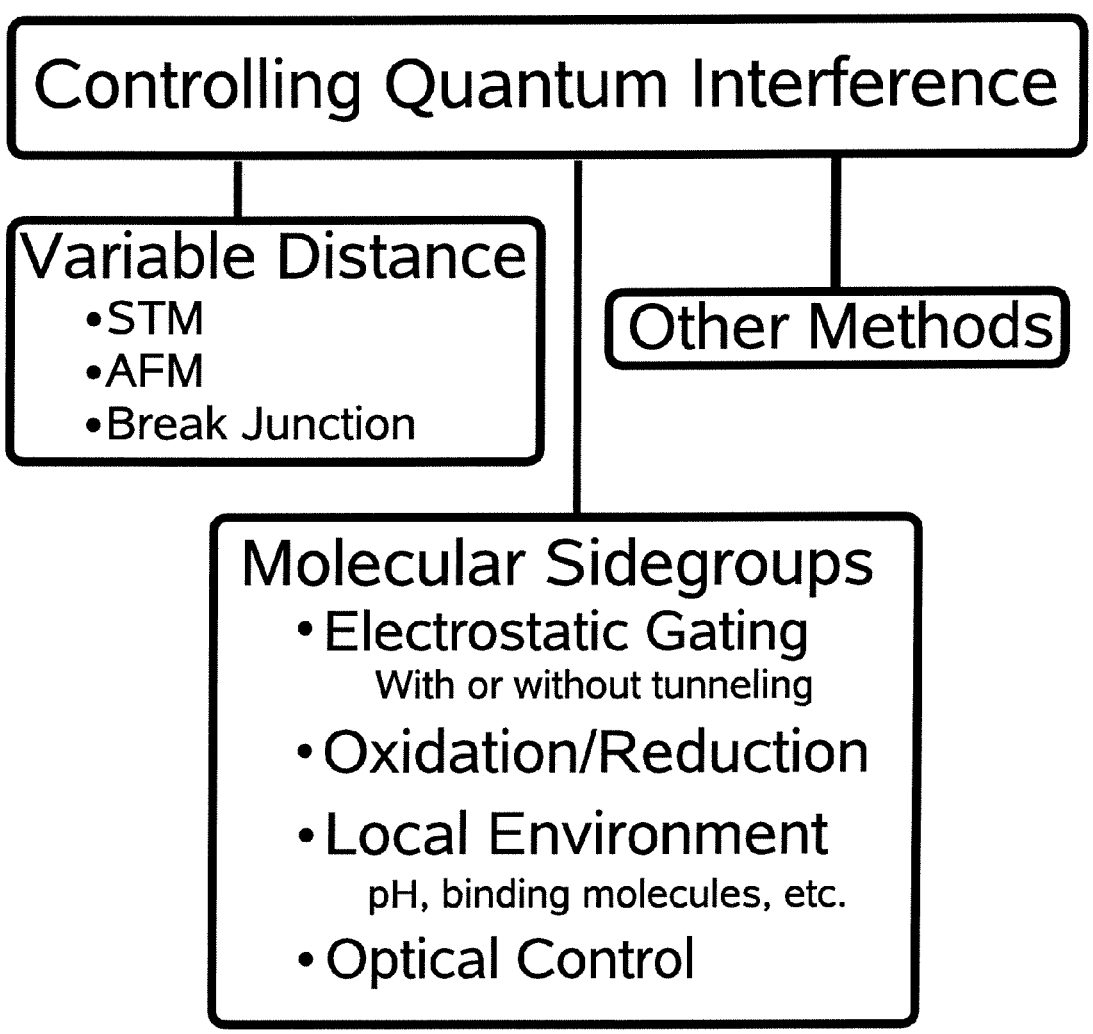
FIG. 11 is a diagram categorizing embodiments of the quantum interference effect transistor by method of controlling quantum interference.

The process for reducing coherence in the charge carriers' transport paths between the first and second nodes likewise includes a number of alternative and/or complementary processes, as depicted by FIG. 11, where the bullet points are non-exhaustive examples. For instance, in one embodiment of the present invention, an electrically conducting body can be positioned in close proximity to the molecule to reduce the coherence in electron transport paths between the first and second nodes. Piezoelectric control, for example, can be used to vary the position of the electrically conducting body, similar to the procedure routinely implemented in scanning tunneling microscopy. The work of G. Binnig and H. Rohrer at 59 REV. MOD. PHYS. 615 (1987), which is hereby incorporated by reference, indicates that the conducting body in one embodiment of the present invention is within a few angstroms of the site where decoherence is needed. The rate associated with decoherence vary by approximately one order of magnitude for every angstrom of separation.

In other embodiments of the present invention, a sidegroup is attached to the molecule as shown in FIGS. 1A and 1B. The sidegroup can be connected to a metal electrode as shown in FIG. 1A to offer elastic scattering and allow charge transport between the first and second nodes. In these embodiments, the degree of scattering is dependent on the bias applied to the third electrode. Alternatively, the sidegroup is not directly attached to a metal electrode. In such embodiments, capacitive coupling is used to affect the degree of elastic scattering.

In other embodiments of the present invention, the sidegroup is not positioned near a third electrode. Rather, it is sensitive to one or more other parameters of the environment: for example, sidegroups with amine or carboxyl moieties have been shown to be sufficiently sensitive to pH (X. Xiao, B. Xu, and N. Tao at 126 J. AM. CHEM. SOC. 5370 (2004)) to function as a quantum interference effect transistor sidegroup for sensing. Since many biological molecules respond to stimuli as trans-membrane proton pumps, the quantum interference effect transistor of the present invention can be utilized in many sensor applications. For example, a pH-sensing quantum interference effect transistor could be located in proximity to bacteriorhodopsin so that current would only flow when green light impinges on the protein.

Such embodiments of the quantum interference effect transistor are devices which convert molecular or electronic changes in the sidegroup into electrical signals. As such, many more sensor applications are available, depending on the choice of sidegroups. Biological molecules, which preferentially dock, bond, or react with only specific partners, in particular provide a sensing mechanism for the quantum interference effect transistors of the present invention. For example, a sidegroup containing a DNA base or short sequence could be used to sense the presence of its complement.

The position of the third lead affects the degree to which destructive interference is suppressed. For benzene, the most effective location for the third lead is shown in FIGS. 1 and 2. Alternatively, the third lead in one embodiment of the present invention is placed at the site immediately between leads 1 and 2, but the transistor effect is somewhat reduced, since coupling to the charge carriers is less. If the third lead were coupled to the benzene ring so as to make all three leads be in a threefold symmetric configuration, then the third lead would be in some instances completely decoupled from electrons traveling between the first two leads. Therefore, this configuration would not be as suitable for current modulation. Indeed, for a monocyclic aromatic annulene, a threefold symmetric lead configuration would likely yield no transistor behavior, unless some asymmetry were introduced.

The quantum interference effect transistor's operating mechanism, tunable coherent current suppression, occurs over a broad energy range within the gap of each monocyclic aromatic annulene. This effect is insensitive to moderate fluctuations of the electrical environment of the molecule. Although based on an entirely different, quantum mechanical, switching mechanism, the quantum interference effect transistor nonetheless reproduces the functionality of macroscopic transistors on the scale of a single molecule.

Fabrication of the QuIET Device

The present application makes use of a number of existing techniques for the fabrication of molecular electronics. These techniques include for example selective attachment and "self-assembling" processes as described by G. M. Whitesides and P. E. Laibinis at 6 LANGMUIR 87 (1990), which is hereby incorporated by reference. These techniques include for example self-alignment and interconnect processes as described by A. Aviram at 110 J. AM. CHEM. SOC. 5687 (1988), which is hereby incorporated by reference. Other work in the field of molecular engineering as described for example by Tour et al., 112 J. AM. CHEM. SOC. 5662 (1990); Tour et al., 113 J. AM. CHEM. SOC. 7064 (1991); Aviram, 110 J. AM. CHEM. SOC. 5687 (1988); Hush et al., "Electron and Energy Transfer through Bridged Systems. 6. Molecular Switches: The Critical Field in Electric Field Activated Bistable Molecules", 112 J. AM. CHEM. SOC. 4192 (1990); Farazdel et al., "Electric Field Induced Intramolecular Electron Transfer in Spiro .pi.-Electrol Systems and Their Suitability as Molecular Electronic Devices. A Theoretical Study", 112 J. AM. CHEM. SOC. 4206 (1990); all of which are hereby incorporated by reference, are applicable to the present invention. These and other techniques such as for example quantum wire processes described by T. Yoshimura et al., "Quantum wire and dot formation by chemical vapor deposition and molecular layer deposition of one-dimensional conjugated polymer", 60 APPL. PHYS. LETT. 268 (1992), which is hereby incorporated by reference, are applicable to the present invention. More specificly, techniques as described in U.S. Pat. Nos. 7,015,336, 6,989,290, and U.S. Pat. Appl. Publ. No. 2006/0001943, the contents of which are all incorporated herein by reference, have applicability to the present invention.

Below are illustrative techniques available in the present invention for fabrication of molecular switching devices and circuitry.

In one embodiment of the present invention, the quantum interference effect transistor is a three-terminal device consisting of a single molecule (or aggregate thereof) connected to a source electrode, a drain electrode, and a gate electrode. One approach for the fabrication of integrated circuits whose components are at the single-molecule scale is the above-noted technique of self-assembly. This technique is based on the fact that certain chemical groups have a strong affinity for specific metal or semiconductor surfaces, and will therefore form strong chemical bonds therewith.

Examples are the thiol group (—SH) which generally binds spontaneously to gold, platinum, silver, and copper and the phosphate group which binds preferentially to aluminum. This permits single monolayers of organic or organometallic compound to be attached to a metal surface. Such methods have been successfully used to place molecules between adjacent electrodes and to make "ohmic" electrical contacts to these molecules. See M. A. Reed, C. Zhou, C. J. Muller, T. P. Burginn and J. M. Tour, *Science,* 1997, 278, 252, the entire contents of which are incorporated herein by reference. These binding groups are referred to in this field as "alligator clips."

Accordingly, in one embodiment of the present invention, the formation of molecular-electronic circuits is based on the following steps:

Step 1: Molecules are synthesized and provided with alligator clips in the positions where the molecule is intended to be connected to the circuit electrodes;

Step 2: A network of metallic electrodes is prepared on an insulating surface according to the circuit specifications. The network contains gaps in all locations where the molecules will be inserted. The size of the gaps must be an effective match to the size of the molecules which must be contained in the gap; the metal composition is intended to have an affinity to the alligator clips on the molecules; and Step 3: The metal network is brought into contact with a solution of the molecules, and self-assembly occurs as the molecules insert in the appropriate gaps. After such attachment occurs, the unbound molecules are rinsed off, effectively completing the quantum interference effect circuit formation.

As outlined above, the self-assembly technique is employed to direct the molecules to the respective locations in the circuit and to attach them to the electrodes, in the correct orientation. That is, the source and drain terminals of the molecule are attached to the source and drain electrodes, respectively, and the third (control) terminal of the molecule is attached to the gate electrode. For certain molecules, this can be achieved simply through a correspondence of the molecular geometry with the patterned layout of the three metallic electrodes. For example, FIG. 1A shows sulfonated vinylbenzene, in which the asymmetrical molecular structure dictates a unique orientation for simultaneous contact to source, drain, and gate electrodes.

In another fabrication process on the present invention, the design of the interconnect metallurgy determines the correct molecular orientation. By distinguishing between the gate electrode metal, the source electrode metal, and the drain electrode metal, the terminals of the molecule can be directed to the proper connection arrangement. This can be accomplished by providing the molecule with specific alligator clips (as described above) for binding each terminal of the molecule to the correct electrode.

With specific consideration to the present invention, the circuit layout in one embodiment is fabricated from one type of metal or semiconductor for the source and drain connections, and from another type of metal or semiconductor for the gate connection. The molecule includes specific alligator clips on the source and drain terminals which can connect to the first material, and a different alligator clip on the gate terminal which will bind exclusively to the second material. The molecules in this embodiment are attached to the three terminals by the above-noted self-assembly process.

The above description relates to molecules in which the source and drain electrodes are interchangeable. However, it is also conceivable that some molecules will require a specific alignment of source and drain. As such, there will be a need to connect one node of the molecule to a specific drain electrode and the second node to another electrode. In such case, each of the three terminals of the molecule can be connected to electrodes fabricated from metals/semiconductors, tailored to connect to the specific alligator clips.

Figure 7:
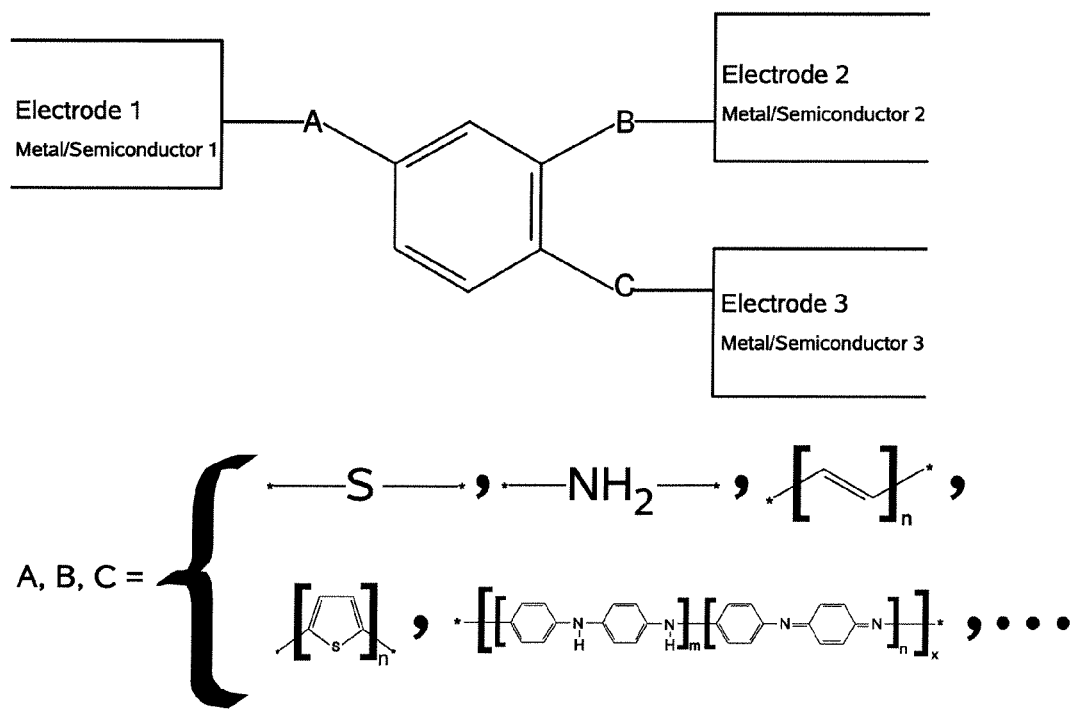
FIG. 7 is a schematic of embodiments of the quantum interference effect transistor for which destructive interference is provided by a benzene ring, and for which control of quantum interference is provided by coupling to a third electrode.

For the case of a benzene-based quantum interference effect transistor, with three metal or semiconductor electrodes, all of the above combinations of one or more electrode materials, molecule-electrode binding groups, and conductive polymer linking groups are considered schematically in FIG. 7. Where binding groups are desired or necessary, they can be included on the end of the polymer linkers of arbitrary length, or bonded directly to the benzene ring. More specific embodiments of the quantum interference effect transistor are shown schematically in FIG. 8 (a benzene-based quantum interference effect transistor with electrodes one and two linked to the ring by polythiophene, and electrode three linked to the ring by an alkene chain) and 9 (an [18]-annulene-based quantum interference effect transistor with three different conducting polymers linking the ring to each of the three different electrodes). In these two figures, A, B, and C, represent the "alligator clip" groups which may be necessary or desirable to bond to the specific materials of electrodes 1, 2, and 3, respectively.

Moreover, the arrangement of the three electrodes can be such that all are in one plane. It is also possible to provide a structure with two electrodes in one plane, and the third in a plane perpendicular thereto.

For the purposes of fabrication, in one embodiment of the present invention, the aromatic component of the quantum interference effect transistor is connected to the source and drain electrodes via conducting polymers, such as polyaniline or polythiophene, whose length can be adjusted to optimize the circuit architecture. In such cases, the molecule would be synthesized with conducting-polymer arms, each of which would be functionalized with an appropriate endgroup ("alligator clip") to attach to the appropriate electrode. The device characteristic would not be effectively changed by this modification, whose primary effect on transport would be to modify the coupling strengths $\Gamma_1$ and $\Gamma_2$. In addition, as noted above, the gate electrode can be connected to a molecular sidegroup, such as an alkene chain chemically bonded to the aromatic component of the device. The alkene chain or other molecular sidegroup can be attached to the gate electrode by an appropriate alligator clip, as described above. The length of this "control" sidegroup can also be tailored to aid self-assembly, but the device characteristics will be modified accordingly, as described above.

In one embodiment of the present invention, multiple quantum interference effect transistors could be interconnected via conducting polymers such as polyaniline or polythiophene via chemical synthesis to form a single larger molecule. This multi-transistor circuit, which could function, e.g., as a logic gate or other complex circuit element, could then be attached to the rest of the circuit via metal or semiconducting electrodes using appropriate alligator clips, as described above.

Examples of specific molecular devices are provided below. It is important to note that the molecules described in such examples are generic in nature, and do not constitute exclusive embodiment of the invention.

EXAMPLE 1

In one embodiment of the present invention, an aromatic molecule is functionalized with "alligator clips" as indicated in FIG. 10, which chemically bind to the source and drain electrodes, which are composed of appropriate metals or semiconductors, and patterned on an insulating substrate, with a separation matched to the molecular geometry. The device is fabricated by self-assembly, as described above. In this configuration, destructive quantum interference blocks the flow of electrons from the source to the drain electrode in the "off-state" of the device. The device may be "switched on" by bringing a conducting body, such as a scanning tunneling microscope tip, into close proximity (within several Angtroms) of the molecule, as illustrated schematically in FIG. 1B. The tunneling interaction of the metal tip with the electronic states of the molecule introduces decoherence, which lifts the destructive interference, and allows current to flow between the source and drain electrodes, as demonstrated in FIG. 3(b), where the lowest curve is calculated in the absence of the metal tip, and each successive higher curve has the tunneling rate between molecule and tip increased by (0.24 eV)/h.

EXAMPLE 2

In one embodiment of the present invention, a molecule having an aromatic ring (such as benzene, [14]-annulene, [18]-annulene, or divalent metal phthalocyanine) with a side group (such as a vinyl linkage, an alkene chain, or another polymer tailored to the specific application) is synthesized with "alligator clips" at the appropriate locations on the ring for contact to the source and drain electrodes, as illustrated in FIG. 10. The alligator clips chemically bind to the source and drain electrodes, which are composed of appropriate metals or semiconductors, and are patterned on an insulating substrate, with a separation matched to the molecular geometry. The device is fabricated by self-assembly, as described above.

In this configuration, destructive quantum interference blocks the flow of electrons from the source to the drain electrode in the "off-state" of the device, when the sidegroup is not activated. The device may be switched on by "activating" the sidegroup, such that its electronic states couple more strongly to those of the aromatic ring. This introduces elastic scattering within the ring, which lifts the destructive interference, and allows current to flow between the source and drain electrodes, as demonstrated in FIG. 3(c).

For the purposes of the present invention, the sidegroup may be any molecule which binds to an aromatic ring, and whose electronic state can be switched between two or more different configurations, e.g., by oxidation/reduction, optical excitation, binding/unbinding of a specific target molecule, etc.

EXAMPLE 3

In one embodiment of the present invention, a molecule having an aromatic ring (such as for example benzene, [14]-annulene, [18]-annulene, or divalent metal phthalocyanine) with a side group (such as for example a vinyl linkage, an alkene chain, or another polymeric semiconductor) is synthesized with "alligator clips" at the appropriate locations on the ring for contact to the source and drain electrodes, as illustrated in FIG. 10, and at the end or other point of the sidegroup, for attachment to the gate electrode. The source, drain, and gate electrodes are patterned on an insulating substrate from appropriate metallic/semiconducting materials for binding to the alligator clips, with a separation matched to the molecular geometry. The three-terminal device is fabricated by self-assembly, as described above. As one particular example of this class of devices, the molecule can be sulfonated vinylbenzene, whose attachment to metal gate, source, and drain electrodes is illustrated in FIG. 1A. This three-terminal device functions with current-voltage characteristics similar to those of a macroscopic transistor, as demonstrated in FIGS. 4 and 5.

EXAMPLE 4

Figure 8:
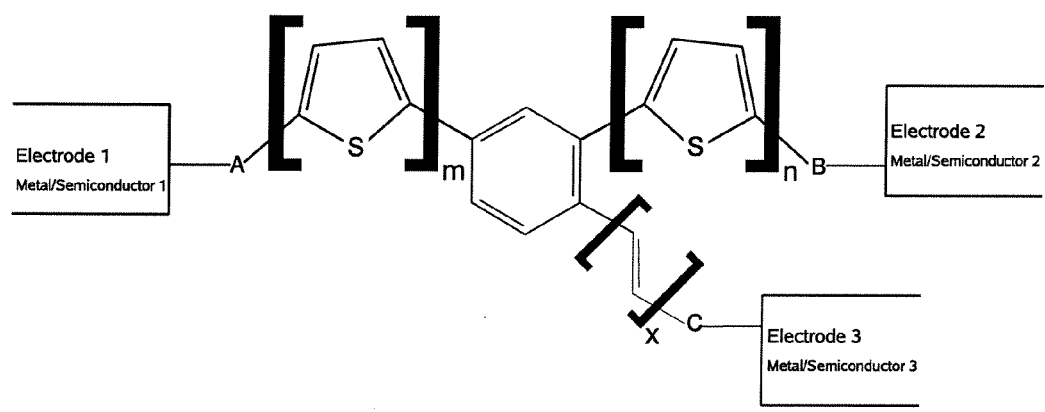
FIG. 8 is a schematic of some embodiments of the quantum interference effect transistor based on a benzene ring, polythiophene linkages to the first and second electrodes, and an alkene linkage to the third (control) electrode.
Figure 9:
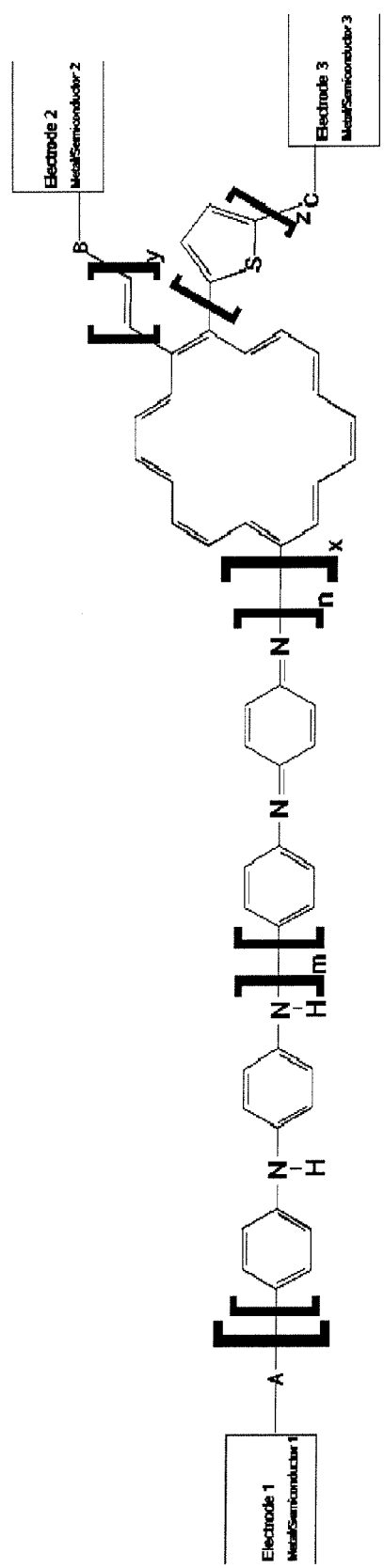
FIG. 9 is a schematic of some embodiments of the quantum interference effect transistor for which destructive quantum interference is provided by an [18]-annulene ring, and for which each of three electrodes is connected by a different conducting polymer linkage.

In one embodiment of the present invention, a molecule having an aromatic ring (such as for example benzene, [14]-annulene, [18]-annulene, or divalent metal phthalocyanine) is synthesized with three sidegroups, two of which are conducting polymers, such as for example polyaniline or polythiophene, the ends of which are functionalized with "alligator clips" for attachment to the source and drain electrodes. The third (control) sidegroup may be an alkene chain or other polymer, and is functionalized with an "alligator clip" for attachment to the gate electrode. A general schematic for this class of device is given in FIG. 7, where the aromatic component is shown as benzene for the purposes of illustration. The source, drain, and gate electrodes are patterned from appropriate metallic or semiconducting materials on an insulating substrate, with the electrodes configured to match the geometry of the molecule. The device is fabricated by self-assembly, as described above. The device characteristics are similar to those of the device in Example 3, but the molecular geometry can be varied in innumerable ways to suit the circuit architecture. Two specific examples of this class of device are shown in FIGS. 8 and 9, respectively, the first based on benzene as the aromatic component, the second based on [18]-annulene as the aromatic component. In each case, the three polymeric sidegroups can be adjusted in length during synthesis of the molecule to suit the desired application.

EXAMPLE 5

In one embodiment of the present invention, two or more quantum interference effect transistor molecules, of the types described in Examples 1 through 4, can be synthesized with polymeric interconnects, such as polyaniline, polythiophene, etc., to form a single larger molecule. This larger molecule is a multi-transistor circuit, which could function, e.g., as a logic gate or other complex circuit element. If desired for a specific application, this circuit could be attached to other circuit elements either by additional conducting polymers, or via "alligator clips" which bind to appropriate metal or semiconducting electrodes in the external circuit.

MODULE EMBODIMENTS

Assembly of the disclosed molecular electronic devices into a complete integrated circuit bears some significant differences from the assembly and packaging of a conventional semiconductor integrated circuit.

One problem for nanoscale device technologies is fanout; due to the need for intermediate current drive (e.g., amplifiers) in these nanoscale devices. One solution according to the present invention is to incorporate nanoscale devices onto a conventional transistor amplifier layout serving as the fabrication substrate and thus provide a "hybrid" device structure. After coating the conventional transistor amplifier layout with an insulating layer, the metal interconnect and molecular layers are fabricated on top, with input to the amplifiers made via holes. This configuration permits one to drive or input an internal signal anywhere in the array.

Figure 12:
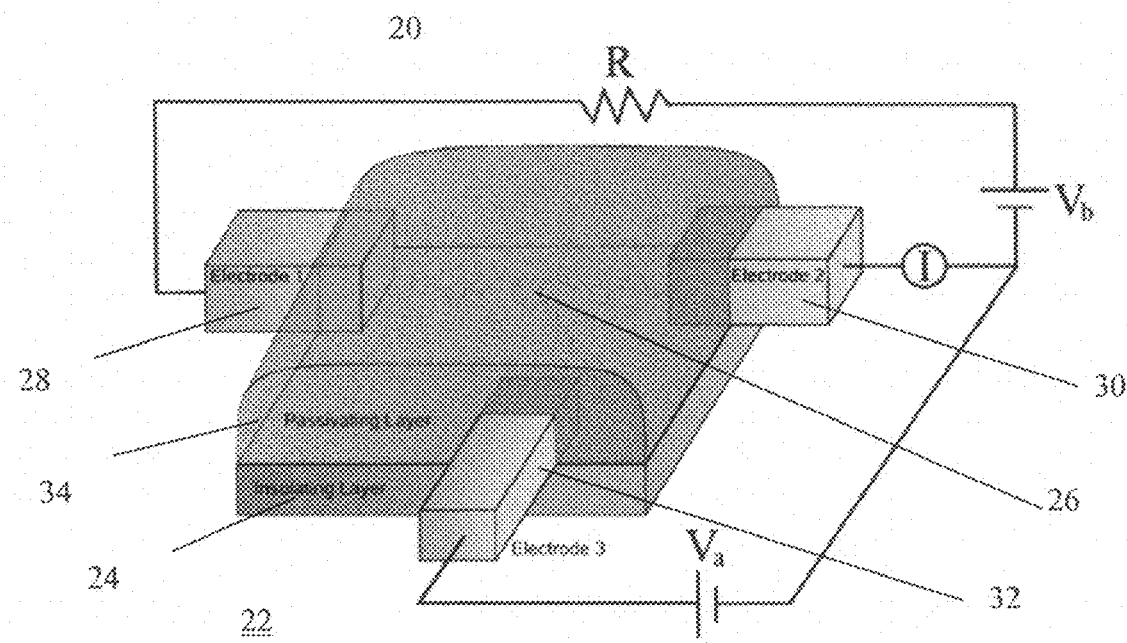
FIG. 12 is a schematic of a hybrid microelectronc structure utilizing conventional electronic circuitry to drive the quantum interference effect switching device of the present invention.

FIG. 12 is a schematic of a hybrid microelectronc structure 20 utilizing conventional electronic circuitry to drive the quantum field effect switching device of the present invention. In this structure, a semiconductor device wafer 22 including electrical devices (not shown) have an electrical insulation layer 24 electrically isolating a molecule 26 disposed thereon. As before, the molecule 26 has first and second nodes in between which destructive quantum interference restricts electrical conduction from the first node to the second node in an off-state. As would be used in conventional circuitry, a plurality of electrical interconnects extend from the electrical devices through the electrical insulation layer for contacting to the molecule 26.

A first electrode 28 connects one of the electrical interconnects to the first node and supplies charge carriers to the first node. A second electrode 30 connects another of the electrical interconnects to the second node and removes the charge carriers from the second node. A control element 32 reduces coherence in charge transport paths between the first and second nodes so as to reduce existing destructive quantum interference and permit flow of the charge carriers from the first node to the second node. A passivation layer 34 can be used in certain embodiments to isolate the molecular electronics from other voltage signals.

In such a hybrid structure, contacts are formed within standard semiconductor fabrication and patterning processed such as for example E-beam direct write, and a probably long-term alternative is masked ion beam lithography to produce the appropriate metal electrodes and spacings for the terminals. After the molecules have been applied to the patterned metal electrodes (e.g., by the self assembly process noted above), a hermetic seal can be applied. The hermetic seal is optional as some applications in sensors may require the exposure to the atmosphere in order for sidegroup molecules to absorb. In one embodiment, a bubble seal is used to enclose an inert atmosphere (e.g., nitrogen or argon) about the attached molecules. An epoxy seal for example could be used. Alternatively, in one embodiment, a passivation layer over the active devices is used to scavenge any small amounts of oxidant from the sealed environment.

Figure 13:
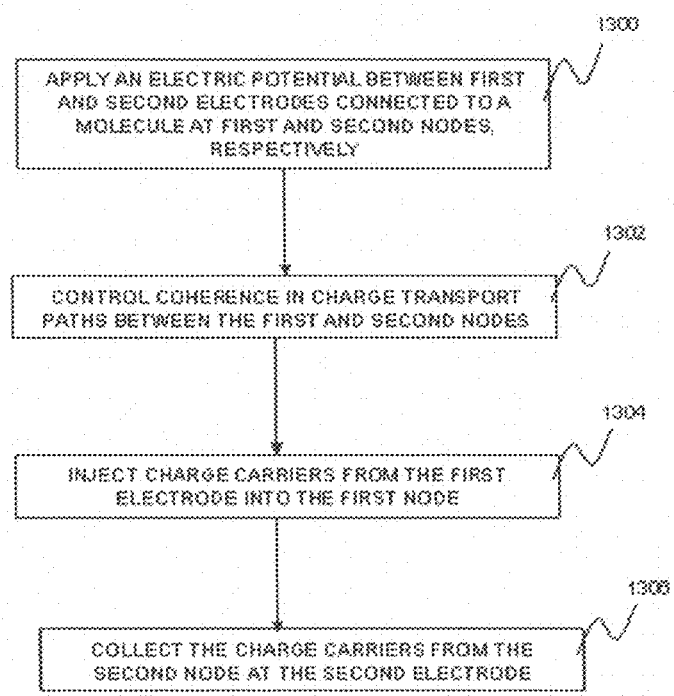
FIG. 13 is a flowchart depicting a method according to one embodiment of the present invention for controlling electrical transport across a molecule.

FIG. 13 is a flowchart depicting a method according to one embodiment of the present invention for controlling electrical transport across a molecule having first and second nodes in between which destructive quantum interference restricts electrical transport from the first node to the second node. At 1300, an electric potential is applied between first and second electrodes connected respectively to the first and second nodes. At 1302, coherence in electron transport paths between the first and second nodes is controlled. At 1304, charge carriers are injected from the first electrode into the first node of the molecule. At 1306, charge carriers are collected from the second node at the second electrode.

The process at 1302 for reducing the coherence in the electron transport paths between the first and second nodes includes a number of alternative and/or complementary processes. For instance, in one embodiment of the present invention, an electrically conducting body can be positioned in close proximity to the molecule to reduce the coherence in charge transport paths (such as for example electron transport paths) between the first and second nodes. Piezoelectric control of the position of the electrically conducting body (similar to that used presently for the positioning of electron scanning microscope tips) can be used. Model calculations indicate that the electrically conducting body must be within a few angstroms, as discussed above. Once the coherence has been reduced to permit conduction such as for example by applying a given voltage bias, a reduction in the bias will restore the coherence and limit charge transport.

In other embodiments of the present invention, at 1302, a sidegroup is attached to the molecule as shown for example in FIGS. 1A and 1B. The sidegroup can be connected to a metal electrode as shown in FIG. 1A to offer a bias to the molecule to reduce coherence or otherwise alter the charge transport paths. Alternatively, in one embodiment of the present invention, the sidegroup may not be directly attached to a metal electrode. In this embodiment, capacitive coupling is used to charge the sidegroup and thereby provide an electrical bias to the molecule. Accordingly, at 1302, a bias is applied to the molecule for example by positioning an electrically conducting body to one side of the molecule to reduce the coherence in the molecule. In another embodiment of the present invention, the sidegroup is electrochemically activated by an oxidation or reduction reaction to respectively remove electrons from or add electrons to the sidegroup.

Biasing can occur by charging to the sidegroup molecule such as for example by capacitively coupling charge to the sidegroup molecule, or supplying charge through an external connection to the sidegroup molecule and tunneling the charge into the switching molecule, or by an oxidizing or reducing of the sidegroup molecule including photo-oxidizing or photo-reducing the sidegroup molecule.

At 1304, charge carriers such as for example electrons are injected in one embodiment of the present invention by tunneling the electrons from the first electrode into the molecule. Holes, polarons, Cooper pairs, or other charged collective modes could also serve as charge carriers. Similarly, at 1306, the charge carriers (e.g., the injected electrons) are collected in one embodiment of the present invention by tunneling the charge carriers from the molecule to the second electrode.

Numerous modifications and variations of the present invention are possible in light of the above teachings. It is therefore to be understood that within the scope of the appended claims, the invention may be practiced otherwise than as specifically described herein.

The invention claimed is:

1. A molecular-based switching device comprising:
a molecule having first and second nodes in between which destructive quantum interference restricts electrical conduction from the first node to the second node in an off-state;
a first electrode connected to the first node and configured to supply charge carriers to the first node;
a second electrode connected to the second node and configured to remove the charge carriers from the second node; and
a control element configured to introduce decoherence or additional paths to permit flow of the charge carriers from the first node to the second node.

2. The device of claim 1, wherein:
the molecule includes a ring structure; and
the first and second nodes are attached at positions along the ring structure whose spacing is 2n bond lengths apart, where n is an integer.

3. The device of claim 2, wherein the molecule comprises an aromatic molecule.

4. The device of claim 3, wherein the control element is configured to introduce charge asymmetrically into the charge transport paths of the aromatic molecule to reduce coherence in the charge transport paths and thereby increase the electrical transport across the molecule.

5. The device of claim 3, wherein the control element comprises:
a molecular sidegroup attached to one side of the aromatic molecule to asymmetrically affect the charge transport paths of the aromatic molecule by the presence or absence of charge on the sidegroup.

6. The device of claim 3, wherein:
the aromatic molecule comprises at least one of a benzene molecule, a vinyl benzene molecule, a sulfonated vinyl benzene, and an annulene molecule.

7. The device of claim 6, wherein:
the control element is connected to a position of the aromatic ring that is a positive odd number of bond lengths away from the position to which the first node is connected.

8. The device of claim 2, wherein the control element is connected to the ring structure by at least one of a vinyl group or an alkene group.

9. The device of claim 1, wherein the control element is configured to introduce charge asymmetrically into the charge transport paths of the molecule to reduce coherence in the charge transport paths and thereby increase the electrical transport across the molecule.

10. The device of claim 9, wherein the control element comprises a third electrode configured to tunnel electrons asymmetrically into the molecule.

11. The device of claim 10, wherein the control element comprises:
a piezoelectric actuator attached to the third electrode and configured to position the third electrode in proximity to the molecule.

12. The device of claim 11, wherein the third electrode is disposed on a side of the molecule opposite the first and second nodes.

13. The device of claim 11, wherein the third electrode is disposed on a side of the molecule adjacent the first and second nodes.

14. The device of claim 1, wherein the control element comprises:
a molecular sidegroup attached to one side of the molecule to asymmetrically affect the charge transport paths of the molecule by the presence or absence of charge on the sidegroup.

15. The device of claim 14, wherein the control element comprises:
a third electrode capacitively coupled to the sidegroup and configured to supply said charge to the sidegroup.

16. The device of claim 14, wherein the sidegroup comprises an electrochemically activated sidegroup.

17. The device of claim 16, wherein the electrochemically activated sidegroup is activated by one of an oxidation or reduction reaction.

18. The device of claim 16, wherein the electrochemically activated sidegroup is activated by one of a photo-oxidation or a photo-reduction reaction.

19. The device of claim 14, wherein the control element comprises:
a third electrode attached to the sidegroup and configured to supply said charge to the sidegroup.

20. The device of claim 19, further comprising:
a current source connected to the first electrode.

21. The device of claim 1, wherein the first and second electrodes comprise a material having a work function for electron tunneling between the first and second electrodes respectively and the molecule.

22. The device of claim 21, wherein the first and second electrodes comprise at least one of palladium, iridium, platinum, and gold.

23. An integrated switching device comprising:
a semiconductor device wafer including electrical devices;
an electrical insulation layer on the semiconductor device wafer;
a plurality of electrical interconnects extending from the electrical devices through the electrical insulation layer;
a molecule disposed on the electrical insulation layer and having first and second nodes in between which destructive quantum interference restricts electrical conduction from the first node to the second node in an off-state;
a first electrode connecting one of the electrical interconnects to the first node and configured to supply charge carriers to the first node;

a second electrode connecting another of the electrical interconnects to the second node and configured to remove the charge carriers from the second node; and a control element configured to introduce decoherence or additional paths to permit flow of the charge carriers from the first node to the second node.

24. The device of claim 23, wherein the control element comprises a sensing element responsive to environmental changes.

25. The device of claim 24, wherein the sensing element comprises at least one of a ph-sensing element, a light-sensing element, or a DNA complement sensing element.

26. The device of claim 1, wherein:
the aromatic molecule comprises a divalent metal-phthalocyanine molecule.

27. The device of claim 1, wherein the first and second electrodes comprise doped semiconductor materials.

* * * * *